(12) United States Patent
Duraffourg et al.

(10) Patent No.: US 9,400,218 B2
(45) Date of Patent: Jul. 26, 2016

(54) BOLOMETER HAVING FREQUENCY DETECTION

(75) Inventors: Laurent Duraffourg, Voiron (FR); Philippe Andreucci, Moirans (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 629 days.

(21) Appl. No.: 13/824,719

(22) PCT Filed: Sep. 23, 2011

(86) PCT No.: PCT/EP2011/066564
§ 371 (c)(1),
(2), (4) Date: Mar. 18, 2013

(87) PCT Pub. No.: WO2012/038524
PCT Pub. Date: Mar. 29, 2012

(65) Prior Publication Data
US 2013/0170517 A1    Jul. 4, 2013

(30) Foreign Application Priority Data

Sep. 23, 2010 (FR) ...................... 10 57672

(51) Int. Cl.
*G01J 5/00* (2006.01)
*G01H 13/00* (2006.01)
(Continued)

(52) U.S. Cl.
CPC .... *G01J 5/28* (2013.01); *G01J 5/02* (2013.01); *G01J 5/023* (2013.01); *G01J 5/40* (2013.01); *G01J 5/44* (2013.01); *H01L 31/18* (2013.01)

(58) Field of Classification Search
CPC ............ G01J 5/34; G01J 5/0853; G01J 5/00; H01L 2924/1461; H01H 13/00; G01K 11/26

USPC ................... 257/415, 54, 467; 438/E31.001; 977/902
See application file for complete search history.

(56) References Cited

U.S. PATENT DOCUMENTS 2,705,274 A * 3/1955 Buck .......................... G01J 5/20
                                                    250/338.1
3,207,900 A * 9/1965 Fitzgerald ................. G01T 1/12
                                                    250/351
(Continued)

FOREIGN PATENT DOCUMENTS

| FR | 2 898 884 A1 | 9/2007 |
|----|---|---|
| JP | 07-083756 A | 3/1995 |

(Continued)

OTHER PUBLICATIONS

Preliminary Search Report issued Apr. 19, 2011 in French Patent Application No. FA 745843 FR 1057672 (with English translation of category of cited documents).

(Continued)

*Primary Examiner* — Gail Kaplan Verbitsky
(74) *Attorney, Agent, or Firm* — Oblon, McClelland, Maier & Neustadt, L.L.P.

(57) ABSTRACT

A bolometer including: at least one electromechanical microsystem or nanosystem, the microsystem or nanosystem including a support and a mobile mass hung from beams above the support, the mobile mass forming an absorber of optical flux; actuation electrodes configured to set the mobile mass in vibration and arranged laterally relative to the mobile mass; and detection electrodes to detect variation in vibration frequency of the mobile mass arranged laterally relative to the mobile mass.

19 Claims, 7 Drawing Sheets

(51) Int. Cl.
*G01K 11/26* (2006.01)
*G01J 5/28* (2006.01)
*G01J 5/02* (2006.01)
*G01J 5/40* (2006.01)
*G01J 5/44* (2006.01)
*H01L 31/18* (2006.01)

(56) References Cited

U.S. PATENT DOCUMENTS

| | | | | |
|---|---|---|---|---|
| 3,508,053 | A * | 4/1970 | John | G01J 5/44 250/338.1 |
| 5,369,280 | A | 11/1994 | Liddiard | |
| 6,118,124 | A | 9/2000 | Thundat et al. | |
| 6,930,569 | B2 * | 8/2005 | Hsu | H03H 3/0072 310/348 |
| 7,745,249 | B2 * | 6/2010 | Lee | B81C 1/0015 257/414 |
| 9,061,895 | B2 * | 6/2015 | Robert | G01P 15/0802 |
| 9,121,771 | B2 * | 9/2015 | Tadigadapa | G01K 7/32 |
| 2007/0222011 | A1 | 9/2007 | Robert et al. | |
| 2008/0035846 | A1 * | 2/2008 | Talghader | G01J 3/26 250/338.1 |
| 2009/0238236 | A1 * | 9/2009 | Fleury-Frenette | G01J 5/58 374/121 |
| 2010/0096709 | A1 | 4/2010 | Roukes | |
| 2010/0283353 | A1 * | 11/2010 | Van Der Avoort | H03H 9/02244 310/300 |
| 2010/0320383 | A1 * | 12/2010 | Blanc | B81C 99/004 250/307 |
| 2011/0147860 | A1 * | 6/2011 | Robert | G01P 15/0802 257/415 |
| 2011/0260810 | A1 * | 10/2011 | Quevy | H03H 3/0072 333/200 |

FOREIGN PATENT DOCUMENTS

| | | |
|---|---|---|
| JP | 10-332480 A | 12/1998 |
| JP | 2009-097951 A | 5/2009 |
| WO | 91 16607 | 10/1991 |
| WO | 97 26556 | 7/1997 |

OTHER PUBLICATIONS

Frank Niklaus, "MEMS-Based Uncooled Infrared Bolometer Arrays-A Review", MEMS/MOEMS Technologies and Applications III, Proceedings of SPIE, vol. 6836D, 6836D, 2007, 15 pages.

Cheng-Ta Ko, et al, "Wafer-level bonding/stacking technology for 3D integration", Microelectronics Reliability, 50, 2010, pp. 481-488.

Göran Stemme, "Resonant silicon sensors", J. Micromech. Microeng: 1, 1991, pp. 113-125.

Robert Adler, "A Study of Locking Phenomena in Oscillators", Proceedings of the IEEE, vol. 61, No. 10, Oct. 1973, 6 pages.

Frank Niklaus, et al., "Performance model for uncooled infrared bolometer arrays and performance predictions of bolometers operating at atmospheric pressure", Infrared Physics & Technology, 51, (2008), pp. 168-177.

S. A. Chandorkar, et al., "Limits of quality Factor in Bulk-Mode micromechanical Resonators", MEMS 2008, Jan. 13-17, 2008, 4 pages.

Sunil A. Bhave, et al., "Fully-Differential Poly -SiC Lamé-Mode Resonator and Checkerboard Filter", Micro-Electro Mechanical Systems, MEMS 2005, 18th IEEE International Conference on, 2005, pp. 223-226.

Mark Scannell, et al., "CEA—LETI 3D Activities and Roadmap", EMC 3D European Technical Symposium Minatec, Jun. 29, 2007, 1 page.

Darius Jakonis, et al., "Readout architectures for uncooled IR detector arrays", Sensors and Actuators, 84, 2000, A Phisical, pp. 220-229.

Robert D. Blevins, "Formulas for Natural Frequency and Mode Shape". Krieger Publishing Company, Chapter 11, 1979, pp. 233-235.

U.S. Appl. No. 14/619,656, filed Feb. 11, 2015, Ruellan, et al.

Office Action issued Jun. 22, 2015 in Japanese Patent Application No. 2013-529658 (with English language translation).

Lee, J E-Y., "A bulk acoustic mode single-crystal silicon microresonator with a high-quality factor", Journal of Micromechanics and Microengineering, Institute of Physics Publishing, vol. 18, No. 6, Total 6 pages, (Jun. 1, 2008), XP 020136862.

Cabuz, C. et al., "Fabrication and packaging of a resonant infrared sensor integrated in silicon", Sensors and Actuators A. vol. 43, No. 1-3, pp. 92 to 99, (May 1, 1994) XP 026615716.

Esashi, M., "Resonant Sensors by Silicon Micromachining", IEEE International Frequency Control Symposium, pp. 609 to 614, (Jun. 5, 1996), XP 010199948.

International Search Report Issued Nov. 10, 2011 in PCT/EP11/66564 Filed Sep. 23, 2011.

U.S. Appl. No. 13/821,701, filed Mar. 8, 2013, Hentz et al.

* cited by examiner

BOLOMETER HAVING FREQUENCY DETECTION

TECHNICAL FIELD AND PRIOR ART

The present invention relates to a bolometer with frequency detection using at least one MEMS or NEMS oscillator.

By detection bolometer is meant any detection structure measuring a flow of particles, in particular optical particles in continuous or pulse mode.

A microbolometer can be considered to be a thermometer sensitive to any rise in temperature caused by an optical flux emitted in the infrared, typically in a wavelength range of 3-5 µm or 8-14 µm.

A prior art microbolometer is formed of a thermistor whose electric resistance varies in relation to the temperature rise caused by the optical flux to be measured. Such a bolometer is described for example in document "*MEMS-based Uncooled Infrared Bolometer Arrays—A Review*", F. Niklaus, C. Vieider, H. Jakobsen, *MEMS/MOEMS Technologies and Applications III, Proceedings of spie Vol.* 6836D, 68360D (2007).

Bolometers at ambient temperature are used for example in night vision systems, in thermography, in the field of security and surveillance e.g. in intrusion detectors.

Prior art bolometers are therefore fixed structures, electrically resistive, whose resistance value changes with the variation in temperature due to the optical flow.

For example, micro-thermistors are structured in different materials such as amorphous silicon (a-Si), or amorphous semiconductors (a-Si:H, a-Ge, a-Ge:H, a-Si$_{1-x}$Ge$_x$:H), or vanadium oxides (Vox).

The thermal resolution of said sensor is determined by different noise sources which are:
- photonic noise (related to random variation of the optical power emitted by the environment);
- phononic noise (related to thermal fluctuation of the environment);
- Johnson's white noise of the thermistor;
- 1/f noise of the thermistor;
- reading electronic noise.

Self-heating occurs caused by polarization of said thermistors.

This phenomenon increases the overall noise of the thermistor (Johnson's white noise and 1/f noise) by modifying dynamic impedance and increasing local temperature.

It is therefore one objective of the present invention to provide a bolometer which does not have any Johnson noise and 1/f noise, avoiding the problem of self-heating described above.

DESCRIPTION OF THE INVENTION

The foregoing objective is reached with a bolometer using at least one electromechanical micro- or nanostructure which is set in vibration at its resonance frequency. The variation in vibration frequency due to heating of the optical flux allows determination of the temperature of the environment in which the structure is located. The electromechanical micro- or nanostructure comprises a mass which deforms along its plane, thereby avoiding modification of the angle of incidence of the optical flux striking the mobile mass.

The bolometer of the invention therefore no longer uses electric resistances but a variation in vibration frequency, the mobile mass of the MEMS or NEMS structure forms the absorber of the bolometer.

In particularly advantageous manner, the variation in vibration frequency is detected by capacitive variation. 1/f and Johnson noises are thereby avoided.

The phenomenon of self-heating due to polarization of the thermistor is therefore eliminated and also the resulting increase in overall noise.

The subject-matter of the present invention is therefore a bolometer comprising at least one electromechanical microsystem or nanosystem, said microsystem or nanosystem comprising a support and a mobile mass hung by suspending means above the support, said mobile mass forming an optical flux absorber, actuation means configured to set the mobile mass in vibration at its resonance frequency in accordance with an own deformation mode of the mass along a median plane thereof, said median plane being substantially fixed relative to the substrate, and detection means to detect the variation in vibration frequency of said mobile mass.

The median plane of the mass is said to be substantially fixed relative to the substrate, since the mass becomes deformed chiefly along its plane without substantially pivoting around the axis or axes defined by the suspending means.

The mobile mass is preferably in plate shape, the median plane of the mobile mass being the plane of the plate. In the present application by "plate" is meant an element extending mainly along a plane and of reduced thickness. It may be a rectangular plate for example or a disc.

According to one embodiment, the actuation means are of electrostatic type and comprise at least one electrode acting on the support and arranged laterally relative to the mobile mass.

According to another embodiment, the detection means are of capacitive type and comprise at least one detection electrode on the support, and arranged laterally relative to the mobile mass.

The suspending means may comprise at least two beams arranged along vibration nodes, or at least four beams arranged along vibration antinodes.

Preferably, the beams have a very narrow thickness and width relative to the thickness of the mobile mass. For example, the thickness of the beams is 10 times smaller than the thickness of the mass. The width of the beam for example is substantially equal to its thickness.

The bolometer of the invention may comprise anti-reflection means on a first face of the mobile mass intended to receive the optical flux.

The bolometer of the invention may also comprise a layer in material having a different coefficient of expansion to that of the mobile mass and deposited on a first face of the mobile mass intended to receive the optical flux. For example, the coefficient of expansion of the layer may be at least twice higher or lower than that of the material of the mobile mass.

Preferably, the anti-reflection means are formed of a layer of material, said layer also forming the layer of material having a different coefficient of expansion to that of the mobile mass.

According to one additional characteristic, the bolometer of the present invention may comprise an optical reflector, this being arranged either on a second face of the mobile mass opposite the first face intended to receive the optical flux, the mobile mass then forming an optical resonant cavity, or on the support facing a second face of the mobile mass opposite the first face intended to receive the optical flux, so as to form an optical resonant cavity between the optical reflector and the second face of the mobile mass.

For example, the mobile mass is substantially disc-shaped, the actuation electrodes and/or the detection electrodes having a curved shape corresponding to the contour of the disc.

The mobile mass and/or suspending means are preferably in a semiconductor, most advantageously crystalline e.g. in silicon or SiGe.

Another subject-matter of the present invention is an assembly of bolometers according to the present invention arranged in an array.

A further subject-matter of the present invention is a temperature measurement assembly comprising one or more bolometers according to the present invention and an electronic control circuit configured to ensure the powering of the bolometer(s), to control the setting in self-oscillation of the mobile mass(es) via the actuation means, and to measure the variation in vibration frequency of the mobile mass(es) via the detection means.

The electronic control circuit advantageously sets the mobile mass or set of mobile masses in vibration in accordance with volume modes such as the extensional wine-glass mode or Lamé mode.

The measurement assembly according to the present invention may also comprise an optical focusing device arranged above at least one bolometer so that it is inserted between the optical flux and the first face of the mobile mass.

The measurement assembly may comprise an optical focusing device for each bolometer or an optical focusing device for all the bolometers.

For example, the electronic control circuit is assembled with the bolometer, the control circuit and the bolometer being superimposed.

The measurement assembly according to the present invention comprising several bolometers advantageously includes at least one actuation wire to send the actuation signals of different frequencies to several bolometers simultaneously, and at least one detection wire to collect the detection signals of different frequencies from several bolometers. This gives rise to multiplexing of the actuation signals and demultiplexing of the detection signals.

The electrical connections between the bolometer and the electronic circuit are formed by through vias for example.

The assembling of the bolometer and electronic circuit can be obtained by bonding.

As a variant, the assembling and connecting of the bolometer and electronic circuit can be obtained by micro-ball bumping.

A further subject-matter of the present invention is a method for preparing at least one bolometer according to the present invention, in which said at least one bolometer is fabricated using surface technology, the suspending means and the mobile mass respectively being obtained in a first and a second layer of different conductive or semiconductive materials.

In one example, the method may comprise the steps of:
depositing an oxide layer on a substrate,
forming a first layer of conductive or semiconductive material,
etching said first layer of conductive or semiconductive material,
depositing a second oxide layer on the first layer of conductive or semiconductive material,
planarizing the second oxide layer stopping at the first layer of conductive or semiconductive material,
depositing a third oxide layer,
etching said third oxide layer to expose the first layer of conductive or semiconductive material at a region intended to be positioned between the suspending means,
forming a second layer of conductive or semiconductive material,
etching the second layer of conductive or semiconductive material,
etching the second oxide layer,
releasing the mobile mass by etching the first oxide layer.

The forming of the first and/or second layer in conductive or semiconductive material is obtained by epitaxial growth for example.

The first layer in conductive or semiconductive material may have a much narrower thickness than the second layer in conductive or semiconductive material.

The etching of the first oxide layer is obtained by deep reactive-ion etching for example.

The fabrication method according to the present invention comprises the depositing and etching step of the anti-reflective layer for example after the formation of the second layer in conductive or semiconductive material.

In another example of the method for producing at least one bolometer according to the present invention, said at least one bolometer is prepared using surface technology, the suspending means and the mobile mass being obtained from a layer of conductive or semiconductive material. The method may then comprise the steps of:
depositing an oxide layer on a substrate,
forming said layer in conductive or semiconductive material,
etching said layer of conductive of semiconductive material for transverse delimiting of the suspending means,
depositing a layer of resin and lithography to delimit the mobile mass relative to the suspending means,
thinning the regions containing the suspending means,
releasing the mobile mass by etching the oxide layer.

The suspending means and the mobile mass can be formed from a layer of conductive or semiconductive material, or in a first and second layer of different conductive or semiconductive materials, the etching of the layer(s) in conductive or semiconductive material can then be deep reactive-ion etching.

The thinning step is performed for example by reactive-ion etching or deep reactive-ion etching.

A deposit and etching step of the anti-reflective layer can be carried out prior to the depositing of resin.

The release of the mobile mass is obtained for example by wet or dry hydrofluoric acid etching.

BRIEF DESCRIPTION OF THE DRAWINGS

The present invention will be better understood with the help of the following description and appended drawings in which.

DETAILED DESCRIPTION OF PARTICULAR EMBODIMENTS

Figure 1:
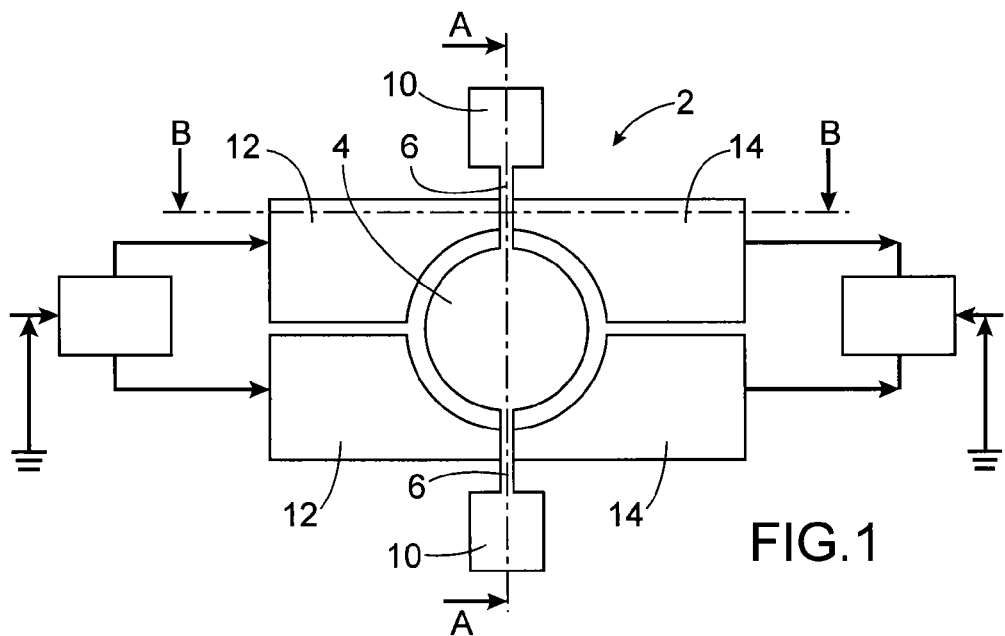
FIG. 1 is an overhead view of an example of embodiment of a bolometer according to the present invention.
Figure 2:
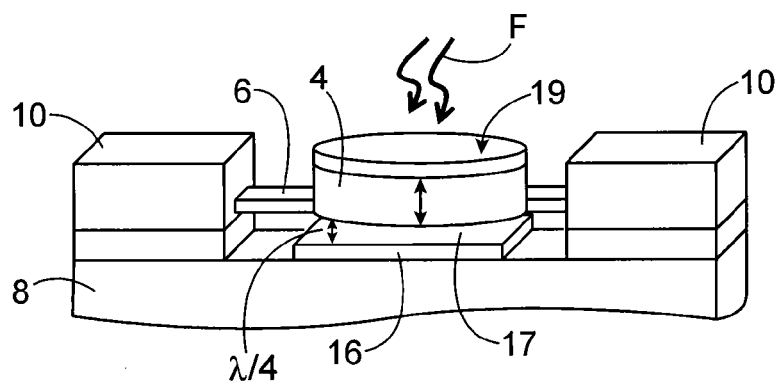
FIG. 2 is a partial perspective view of the bolometer in FIG. 1.
Figure 3:
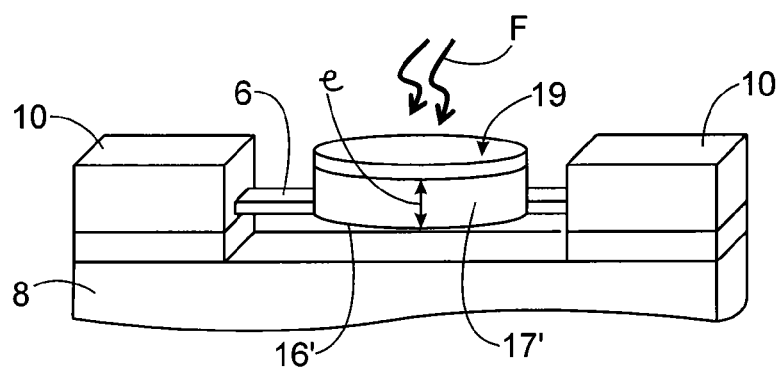
FIG. 3 is a partial perspective view of a variant of the bolometer in FIG. 2.

FIGS. 1, 2 and 3 show an example of embodiment of a bolometer 2 according to the present invention.

The bolometer 2 comprises a suspended part 4 forming at least one mobile mass, hung from beams 6, said beams being anchored on a substrate 8 which can be seen in FIGS. 2 and 3, by means of anchor pads 10, the substrate 8 and the pads 10 forming the fixed support for the bolometer. The bolometer also comprises means for setting the mobile mass 4 in vibration at its resonance frequency, and means for detecting the variation in vibration frequency of the mobile mass 4 as a function of temperature.

The actuation means, in the illustrated example, are of electrostatic type and comprise one or more actuation electrodes 12.

In this particularly advantageous embodiment, the detection means are of capacitive type and comprise one or more detection electrodes 14. It will be seen below that this detection mode is in no way limiting.

A description will now be given of the general detection principle used by the bolometer according to the present invention.

The mobile mass forms an optic flux absorber. In the remainder of the description the terms "mobile mass", "vibrating mass" or "absorber" will be used indifferently to designate the mobile mass 4.

The mobile mass 4 is set in vibration at its resonance frequency. Closed loop electronics e.g. of Phase-Lock Loop (PLL) type allow the mobile mass 4 to be kept in vibration at controlled amplitude and to have continuous knowledge of its mechanical oscillation frequency. This resonance frequency is sensitive to variations in temperature of the environment following a law dependent on the structural material of the bolometer. With small temperature variations it is possible to use a linear law to describe the phenomenon.

Frequency behaviour relative to temperature is then fully characterized by the thermal coefficient $\alpha_T$:

$$\alpha_T = \frac{1}{f}\frac{\partial f}{\partial T} \quad \text{(I)}$$

where f is the resonance frequency of the system.

The response $\Re$ which is the frequency/temperature ratio is finally given by the following equation:

$$\Re = \frac{f_0 \alpha T}{G} \quad \text{(II)}$$

where G is the heat conductance of the suspension beams.

Therefore, any measurement of the variation in frequency will provide information on the temperature of the environment.

A detailed description will now be given of the bolometer according to the invention.

The mobile mass 4 forms the absorber of the bolometer and will be subjected to infrared optical fluxes.

Figure 4A:
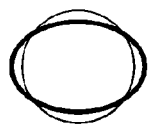
FIGS. 4A to 4C are schematic illustrations of different deformation modes of the mobile part of the bolometer which are possible with the invention.
Figure 4B:
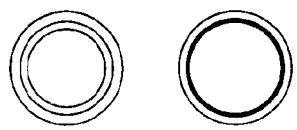
Figure 4C:
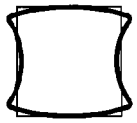

In the illustrated example, it is substantially disc-shaped, however this shape is in no way limiting, and it may be disc-shaped or of quadrilateral shape for example a square such as shown in FIGS. 4A to 4C. In general, the mass is a plate, which is of narrow thickness relative to its length and width if it is a plate of rectangular shape, or of narrow thickness relative to its diameter for a plate that is disc-shaped. In the present description, by plate is meant any element having a large cross-sectional area relative to its thickness.

The mobile mass is made in a semiconductor material for example such as amorphous silicon.

Most advantageously, it is formed of a crystalline semiconductor.

In general, the bolometer is associated with a system for focusing the optical flux symbolized by arrows F, the dimensions of the mobile mass 4 then being chosen so that its surface is at least equal to the surface of the optical diffraction spot induced by the focusing system, the mobile mass or absorber being located in the focal plane of the focusing system.

For example the dimensions of the mass are 20×20 µm, if the mobile mass is a square plate. Preferably, if the mass is disc-shaped its diameter is at least 17 µm.

In the illustrated example, the beams 6 are two in number, but it could be envisaged to have four beams positioned at the vibration nodes.

In addition, the suspension beams 6 in the illustrated example are straight, diametrically opposite beams oriented substantially orthogonally relative to the direction of deformation of the mobile mass.

According to one characteristic of the present invention, the mobile mass 4 vibrates along its median plane which is substantially parallel to the substrate. The median plane is substantially fixed relative to the substrate. The mass chiefly deforms along its plane without pivoting substantially around the axis defined by the suspension beams 6.

The mobile mass 4 vibrates in accordance with volume modes e.g. a wine-glass or extensional mode if it is disc-shaped as illustrated in FIGS. 4A and 4C respectively, and in accordance with a Lamé mode or extensional mode if it is of quadrilateral shape as illustrated in Figure C. With these volume modes it is possible to reach high frequencies (typically 100 MHz to a few GHz) whilst preserving high quality factors Q (Q=10,000 to 100,000). Detection at high frequency combined with a high quality factor allows limitation of frequency jitter and a stable oscillator to be obtained. Under these conditions, thermal resolution will therefore not be limited by the quality of the mechanical oscillator. These modes allow extremely robust systems to be obtained, in particular compared with a twisting mode of the mass. During its movement the mass remains perpendicular to the optical axis.

According to the present invention, the actuation electrodes 12 are arranged laterally relative to the mobile mass 4. The actuation electrodes 12 are intended to set the mobile mass 4 in vibration at its resonance frequency by generating electrostatic forces.

The detection electrodes 14 are intended to detect a variation in vibration frequency of the mobile mass due to a variation in temperature as will be seen below, this detection being of capacitive type, the capacitances being formed between each detection electrode 14 and the opposite-facing contour portion of the mobile mass 4. The variation in capacitance is due to the variation in distance separating each detection electrode and the contour portion of the mobile mass 4.

In the example illustrated in FIG. 1, the bolometer comprises two actuation electrodes 12 side-by-side and two detection electrodes 14 side-by-side arranged opposite the actuation electrodes 12 relative to the beams 6. The two detection electrodes allow differential measurement. When the capacitance between the mass and one of the electrodes increases, the second capacitance formed by the mass and the second electrode is reduced. Therefore, by subtracting the two signals the continuous background is eliminated whereas the useful signal is multiplied by 2. With this method it is easier to read the signal, to facilitate detection of the resonance peak and to eliminate the impact of drifts of the continuous background on the signal.

The bolometer could comprise a single actuation electrode and a single detection electrode, or even at least one electrode which simultaneously allows detection and actuation without departing from the scope of the present invention.

In the illustrated example, the electrodes 12, 14 have a concave face 12.1, 14.1 corresponding to the contour of the mobile mass 4.

The bolometer is associated with an electronic circuit and an electric power supply to control the actuation electrodes 12, so as to set the mobile mass 4 in vibration and to receive data from the detection electrodes 14.

The distance separating the electrodes 12, 14 and the contour facing the mobile mass 4 is preferably between 50 nm and 200 nm, more preferably of the order of 100 nm. As described previously, the detection of the variation in vibration frequency is obtained by measuring the variation in capacitance induced between the mobile mass 4 and one or more detection electrodes 14. As explained below, measurement may be direct or differential.

The bolometer according to the present invention, in particular the locating of vibration in a plane parallel to the beams, has the advantage of not modifying the orientation of the absorber 4 relative to the optical flux F and hence of not modifying the angle of incidence of the optical flux with the absorber.

A description will now be given of the bolometer illustrated in FIG. 2 in which the electrodes 12, 14 are not shown.

In this example, the bolometer comprises an optical reflector 16 deposited on the substrate on the back face of the mobile mass 4 forming therewith an optical resonant cavity 17. The optical reflector 16 is a layer of metal for example. The distance separating the optical reflector 16 and the face opposite the mobile mass 4 is chosen so as to form an optical resonant cavity of Fabry-Perot type; this distance is equal to $\lambda/4$, $\lambda$ being the wavelength of the optical flux to be measured.

Advantageously, the bolometer may comprise anti-reflective means 19 formed of layers of a few microns deposited on the mobile mass on its face opposite the face facing the substrate. These layers allow "impedance adaptation" with the ambient medium and optimize the transmission rate of the optical flux in the mass. For example, this may be a metallic layer e.g. of TiN, Ti/TiN in a thin layer typically a few nanometers, or a layer of dielectric material such as SiN, $SiO_2$ for example or an optical multi-layer adapted to the intended wavelength range.

Also advantageously, a layer of material having a coefficient of expansion different from that of the mobile mass is deposited on the mobile mass 4, which makes it possible to optimize the thermal coefficient $\alpha_T$ and thereby modulate frequency as a function of temperature.

This layer may be a metal e.g. TiN, a semiconductor e.g. Ge) or a dielectric e.g. SiN or any oxide-based material or any other material having a coefficient of expansion much different from that of the constituent material of the mobile mass 4.

This layer is chosen so as not to decrease the transmission rate of the optical flow in the mass.

Advantageously, it could also form the anti-reflective layer. In non-limiting manner, it could then be formed of an optical multilayer material for example adapted for anti-reflective use.

As an example, a layer of Ti/TiN allows optimization of optical flux transmission and has a coefficient of expansion of the order of $10^{-5}$ $K^{-1}$ which is about 5 times greater than that of silicon which is $2.6 \cdot 10^{-6}$ $K^{-1}$.

The suspension beams 6 in particularly advantageous manner are of narrow thickness compared with the thickness of the mass, this thickness being at least ten times smaller than that of the mass 4, and on this account they also have a smaller cross-sectional area than the mobile mass 4.

They may be of nanometric cross-section, for example 50 nm×50 nm for a beam of square cross-section, whilst the absorber may have a thickness of 500 nm.

The narrow thickness of the beams relative to the thickness of the mass makes it possible to minimize measurable noise equivalent temperature difference designated "NETD". This is proportional to the noise of the sensor (thermomechanical noise, Johnson's white noise ... ) and inversely proportional to thermal response (R):

$$NETD \propto \frac{S_\omega(\omega)\sqrt{BW}}{\Re} \left( \frac{W}{\sqrt{Hz}} \right)$$

$S_\omega$ is the noise expressed in resonator frequency. It expresses its frequency stability.

To minimize NETD, it is therefore sought to obtain a major response. This response itself is inversely proportional to thermal conductance G.

$$\Re = -\frac{\eta \alpha_T \omega_0}{G} (Hz/K)$$

$\omega_0$ is the resonance frequency of the micro-resonator, $-\alpha_T$ is the coefficient giving the variation in frequency as a function of temperature, $\eta$ is related to the absorption rate.

It is therefore sought to reduce G.

By giving the beams a smaller thickness than the mass, the beams are very resistive from a thermal viewpoint, which makes it possible to minimize conductance G. In addition, the thermal power dissipated by the beams is reduced.

In particularly simple and efficient manner, highly advantageous thermal uncoupling is obtained between the absorber 4 and the support since the suspension beams 6 are heat diffusion regions.

The power dissipated by the beams is determined by their thermal conductance G, $$\delta P = G \delta T \quad (III)$$

where δP is dissipated power and δT is the temperature difference between the cold source (the support) and the hot source (the absorber).

By means of the beams having a small cross-section, G is minimized which reduces heat losses and the associated thermal noise called phonon noise. G will be all the more reduced the longer the length of the suspensions, the beams being sized so as to ensure the mechanical strength of the bolometer.

Returning to equation II, it is ascertained that by minimizing G the response $\Re$ is maximized.

In addition, it is advantageous to control the thermal constant $\tau_{th}$ given by the ratio C/G, C being the thermal capacity of the absorber, which corresponds to the time taken by the bolometer to reach its state of equilibrium in response to one Dirac of optical power, so as to obtain a low thermal constant $\tau_{th}$.

Additionally, materials are preferably used which guarantee very good frequency stability (i.e. a scarcely noisy resonant component). For this purpose, advantageous use is made of crystalline materials, Si, Ge or any other semiconductor.

For example, the mass is in TiN and is of greater thickness of the order of 100 nm to 500 nm. The cross-sectional thickness of the suspension beams is in the order of 10 times thinner for a width of 10 nm to 100 nm.

As an example, a mass can be produced having a thickness of 500 nm and a beam having a thickness of about 50 nm.

In FIGS. 2 and 3, the beams are straight. As a variant, in FIGS. 6A to 6C other beam shapes can be seen.

Figure 6A:
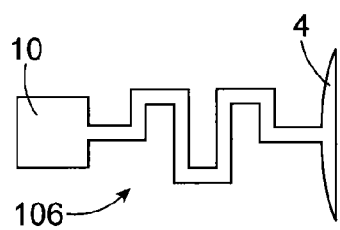
FIGS. 6A to 6C are overhead views of different examples of embodiment of the suspension beams, FIGS. 7A, 7D to 7H and 7A' to 7C', 7E', 7G' and 7H' are schematic illustrations of different steps of an example of a method for obtaining a bolometer according to the present invention, the illustrations respectively being taken along planes A-A and B-B in FIG. 1.

In FIG. 6A, the beam 106 has a crenel profile.

Figure 6B:
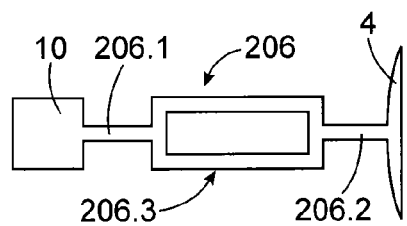

In FIG. 6B, the beam 206 has two straight end portions 206.1, 206.2 and a central portion 206.3 at which the beam 206 is divided to form a hollowed-out rectangle.

Figure 6C:
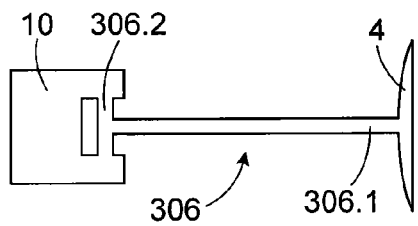

In FIG. 6C, the beam 306 comprises a straight main beam 306.1 and a transverse secondary beam 306.2 on the side of the anchor pad 10 to which the main beam is connected. The transverse beam 306.2 is connected to the anchor pads 10 via its two axial ends.

By choosing beam shapes allowing the relaxing of stresses and promoting volume movement of the mobile mass 4, it is possible to optimize the quality factor of the bolometer. The three variants shown in FIGS. 6A to 6C effectively allow slight displacement along the axis of the arms.

FIG. 3 shows a variant of the bolometer in FIG. 2, in which the optical reflector 16' is arranged on the lower face of the absorber 4, and it is then the absorber 4 itself which forms the resonant cavity 17'. The thickness of the absorber 4 is then chosen so as to form this resonant cavity 17' and its thickness e is of the order of λ/4.

Figure 5A:
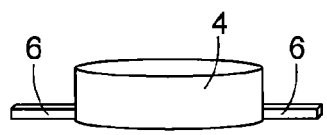
FIGS. 5A to 5C are perspective views of different examples of arrangement of the suspension beams relative to the mobile part of the bolometer according to the invention.
Figure 5B:
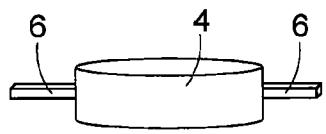
Figure 5C:
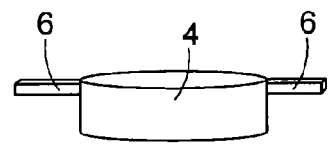

In the examples of embodiment in FIGS. 2 and 3, the beams are positioned at a lower end of the mobile mass 4, however this arrangement is in no way limiting. In FIGS. 5A to 5C, different arrangements of the beams can be seen relative to the mobile mass.

In FIG. 5A, the beams 6 are positioned at the lower end of the mobile mass 4. In FIG. 5B, the beams 6 are positioned in a median plane of the mobile mass, the bolometer then advantageously having a perfectly symmetric structure. In FIG. 5C, they are positioned at the upper end of the mobile mass.

The bolometer of the present invention offers high quality factors with resonance frequencies of the order of 50 MHz to 100 MHz which allows optimization of the bolometer response.

In addition, the two examples of embodiment illustrated in FIGS. 2 and 3 have comparable mechanical performance levels.

In one alternative embodiment, provision can be made for detection of piezoresistive type by arranging piezoresistive gauges along the vibration antinodes to take advantage of mechanical stress.

Figure 12:
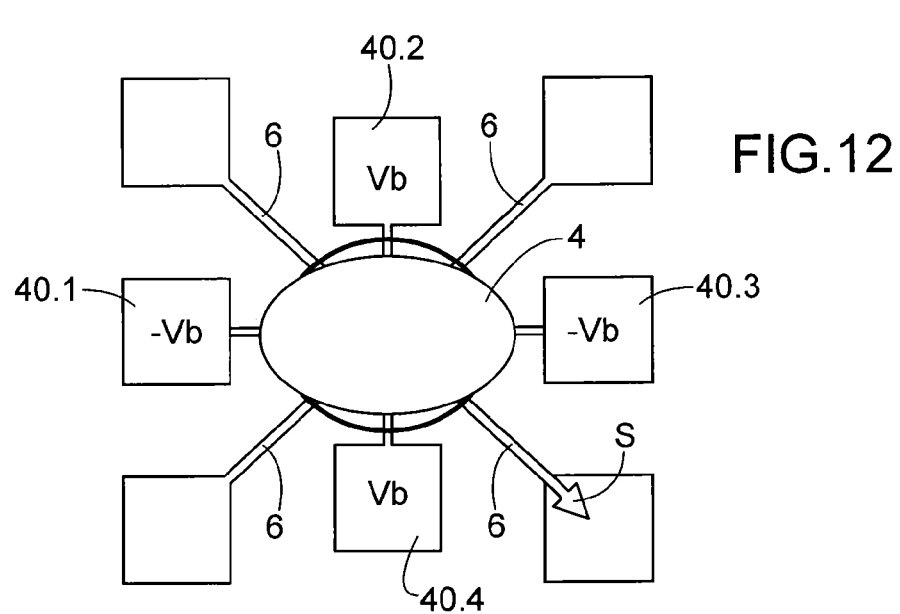
FIG. 12 is an overhead view of an example of embodiment of a bolometer according to the present invention with capacitive detection.

FIG. 12 shows an example of embodiment of said bolometer with piezoresistive detection.

In this example, the bolometer comprises four suspension beams 6 and four piezoresistive strain gauges 40.1 to 40.4 alternately arranged around the mass. As shown in FIGS. 4A to 4C, e.g. FIG. 4A, the plates deform and the sidewalls are either concave or convex. The piezoresistive gauges here are arranged at the vibration antinodes of the mobile mass i.e. the gauges are connected to the mobile mass at the centres of the sidewalls thereof. The suspension beams 6 are arranged at the vibration nodes of the mobile mass. The bolometer, as in the case of capacitive detection, comprises excitation electrodes (not illustrated) to excite the mobile plate.

The gauges 40 are either compressed or stretched as a function of time. These stresses will therefore generate a variation in the electrical resistance of the gauges as a function of time. For example, by polarizing the gauge 40.1 at a reading voltage (+Vb) and the following gauge 40.2 at voltage (−Vb), it is possible to collect an output signal S either on one or both gauges 40.3, 40.3 or on one of the suspension beams 6. The output signal S is proportional to 2ΔR/R*Vb, R being the resistance of the gauge. ΔR is proportional to the variation in strain or the deformation of the plate. The configuration in FIG. 12 allows differential measurement.

Preferably, the stress gauges are of short length to minimize their electrical resistance.

Alternatively, it is possible only to have four or three piezoresistive strain gauges used both as suspending means and as measurement and detection means.

This alternative offers greater ease in the arrangement of the excitation electrodes. If there are three gauges, one gauge is polarized at a voltage −Vb, the other at voltage +Vb and the third is used to collect the output signal.

It is also possible for example to make provision for several gauges and several suspending means, or one single suspending means and a single gauge. It is also possible only to have two suspensions.

FIG. 12 describes differential measurement, but it is possible to perform simple measurement with two gauges subjected to the same stress, or a single gauge.

Figure 10:
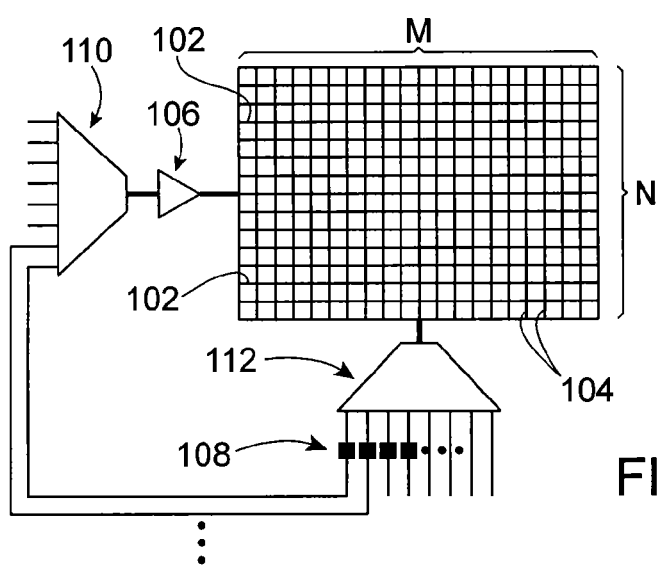
FIG. 10 is a schematic illustration of an array of multiplexed bolometers according to the present invention.

In one application of particular interest, a device can be provided comprising a plurality of bolometers arranged in an array comprising N×M bolometers, as illustrated in FIG. 10, for example to produce an infrared imaging device. For example, the array of bolometers is interfaced with electronics of CMOS type, capable of setting each absorber in self-oscillation. The array scanning method may indifferently use time multiplexing or frequency multiplexing allowing direct read-off from all the bolometers. Each frequency then encodes the position of a bolometer.

Each bolometer is excited by an alternating electric signal. Advantageously, a single actuation wire may be used to send the N×M actuation signals simultaneously to the N×M bolometers. Each excitation signal is at the own frequency of one bolometer of the array. It is sufficient that two consecutive frequencies should be far enough apart to avoid spectrum overlapping, typically separated by fi/Q, fi being the resonance frequency of the $n^{th}$ bolometer.

Similarly an electric wire in which all the detection signals are passed is sufficient.

A device formed of a plurality of bolometers comprising one or more conducting actuation wires, even one wire per bolometer, and/or one or more conducting detection wires, even one wire per bolometer, does not depart from the scope of the present invention.

In this case, upstream multiplexing electronics are provided for actuation and downstream demultiplexing electronics for detection. With this arrangement it is possible to reduce the number of wires to be used, thereby minimizing thermal radiation induced by interconnections.

In FIG. 10 an example can be seen of a device containing bolometers in the form of an array using the above-described addressing mode with setting in self-oscillation of the bolometers. The array comprises N rows and M columns.

The device comprises N actuation wires 102, that are vertical in the illustrated example, and M detection wires 104 positioned horizontally in the illustrated example. A bolometer is positioned at an intersection of an actuation wire 102 and a detection wire 104, each bolometer forming a pixel in an imaging device. In this example, each actuation wire sends the actuation signals onto M bolometers and each detection wire collects the detection signals on N bolometers.

Each bolometer is set in oscillation in a closed self-oscillating loop comprising an amplifier 106 to compensate for signal losses and a set of phase shifters 108 to obtain zero input/output phase shift for each self-oscillation loop corresponding to each bolometer.

In the illustrated example this amplifier is common to all the bolometers. In addition, a pre-amplifying and multiplexing system 110 is used to send actuation signals into the wires 102, and a pre-amplifying and demultiplexing system 112 is used to separate all the detection signals.

The bolometer of the present invention may advantageously be prepared using surface technology, but other methods can be used such as bulk technologies e.g. deep or KOH etching.

A description will now be given of an example of a surface technology method for fabricating a bolometer according to the present invention such as illustrated in FIG. 3.

FIGS. 7A, 7D to 7H and 7A' to 7C', 7E', 7G' and 7H' schematically illustrate the elements obtained at the different steps of the fabrication method. FIGS. 7A, 7D to 7F are cross-sectional views of the elements along plane A-A in FIG. 1, and FIGS. 7A' to 7C', 7E', 7G' and 7H' are cross-sectional views of the elements along plane B-B in FIG. 1.

This first method uses epitaxy of a semiconductor, preferably crystalline (Silicon-Silicon or SiGe for example) for forming the beams 6 in a first layer of narrow thickness, then the mobile mass 4 in a second layer of greater thickness, epitaxied on the first layer.

Figure 7A:
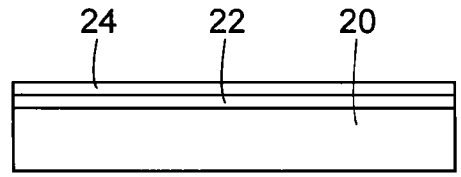
Figure 7A:
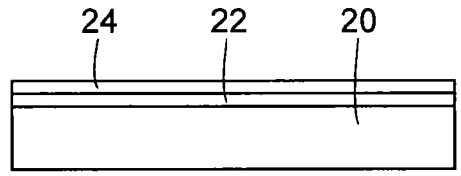

At a first step illustrated in FIGS. 7A and 7A', a substrate 20 is chosen e.g. in silicon on which an oxide layer 22 is deposited e.g. SiO$_2$, using thermal oxidation for example or PECVD oxide. The layer 22 has a thickness of 2.5 µm for example, corresponding to the length λ/4 for an optical beam in the range of 8 to 14 µm. For an optical beam in a range of 2 to 5 µm, the thickness of the layer 22 will be about 900 nm.

Next, a layer in amorphous silicon for example is formed designated α-Si hereafter, using bulk epitaxy for example. This layer 24 is relatively thin and will be used to form the beams 6. The thickness of the layer 24 is between 50 nm and 100 nm for example.

Lithography is then performed followed by etching of the layer 24 of α-Si to define the suspension beams 6 and the first layer forming the mobile mass. Etching is halted at the SiO$_2$ layer 22.

Figure 7B:
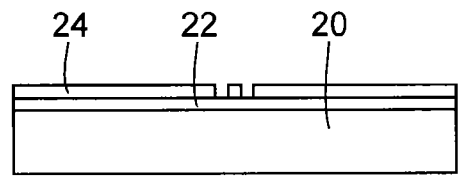

The element thus obtained is illustrated in FIG. 7B'.

The depositing of another oxide layer 26 e.g. SiO$_2$ is then carried out (using PECVD for example) on the etched layer 24. The layer 26 has a thickness of 400 nm for example.

This layer 26 is then planarized stopping at the α-Si layer 24.

Figure 7C:
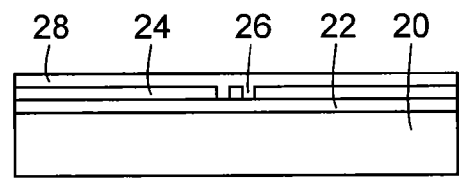

A further oxide deposit 28 is made e.g. of SiO$_2$, having a thickness of 0.4 µm for example. The element thus obtained is illustrated in FIG. 7C'.

Figure 7D:
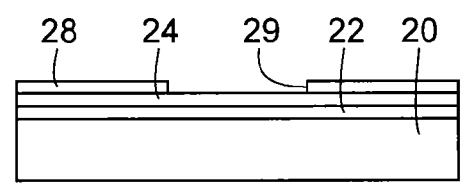

At a following step, lithography via etching is performed in the layer 28 down to layer 24, to form a window 29 to allow epitaxy of α-Si on the layer 24 as illustrated in FIG. 7D.

Figure 7E:
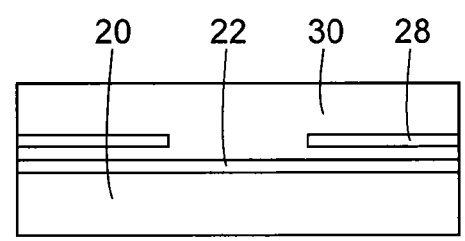
Figure 7E:
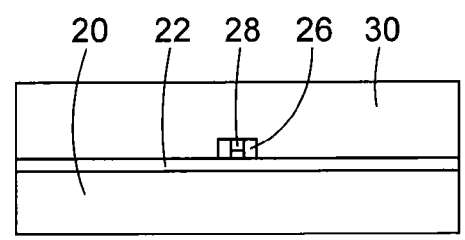

Next a layer 30 of α-Si is deposited as shown in FIGS. 7E and 7E', for example over a thickness of about 1 µm.

As a variant, it could be envisaged that different materials are used for the mass and beams, providing different thermal capacities for example.

Figure 7F:
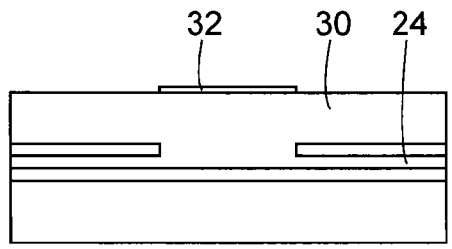

At an advantageous following step, a layer is deposited intended to form the anti-reflective optical layer, for example in Ti/TiN, followed by lithography and etching to delimit the anti-reflective portion, as can be seen in FIG. 7F.

Figure 7G:
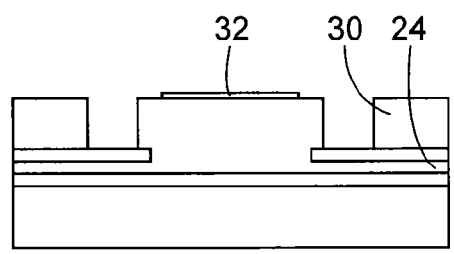
Figure 7G:
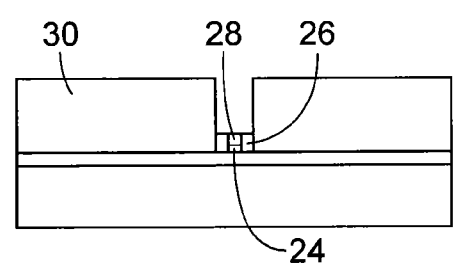

At a following step, lithography and anisotropic etching are carried out on layer 30, e.g. by Deep Reactive-Ion Etching (DRIE) to form the resonant structure, stopping at the oxide layer 28. The element thus obtained is illustrated in FIGS. 7G and 7G'.

Finally, at a following step, the mobile mass 4 is released for example by wet or dry etching with hydrofluoric acid of the oxide layer 28.

Figure 7H:
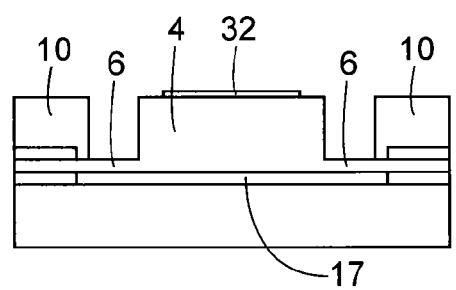
Figure 7H:
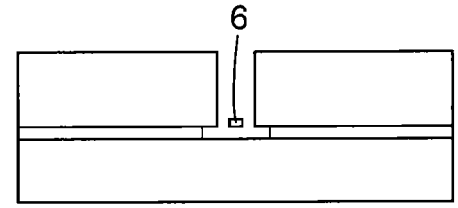

The final structure is shown in FIGS. 7H and 7H'. The mobile mass 4, the beam 6, the anti-reflective layer 19 and the resonant cavity 17 can be seen.

The reflective layer is formed using post-processing for example on the substrate carrying the electronics, this substrate then being assembled with the substrate carrying the bolometers.

A description will now be given of another example of a method of the invention for obtaining a bolometer as in FIG. 3.

FIGS. 8A, 8C to 8F and 8A', 8B' and 8D' to 8F' schematically illustrate the elements obtained at the different steps of the second example of a fabrication method. FIGS. 8A, 8C to 8F are cross-sectional views of the elements along plane A-A in FIG. 1, and FIGS. 8A', 8B' and 8D' to 8F' are cross-sectional views of the elements along plane B-B in FIG. 1.

In this second method, the beams and mobile mass are not formed by depositing a first layer of α-Si, but by thinning a layer of α-Si at the beams, simultaneously forming the beams 6 and the mobile mass 4.

Figure 8A:
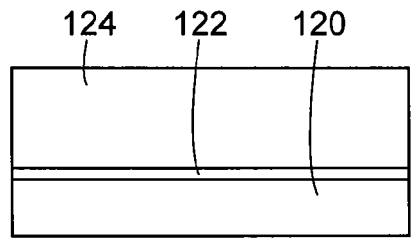
FIGS. 8A, 8C to 8F and 8A', 8B' and 8D' to 8F' are schematic illustrations of the different steps of a method for obtaining another example of a bolometer, the illustrations respectively being taken along planes A-A and B-B in FIG. 1.
Figure 8A:
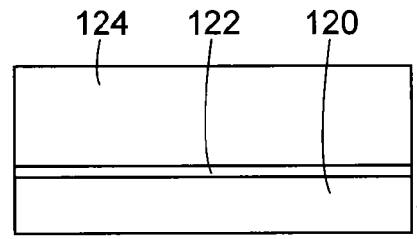

At a first step illustrated in FIGS. 8A and 8A', a substrate 120 is chosen e.g. in silicon, on which an oxide layer 122 is deposited e.g. SiO$_2$, using thermal oxidation for example. The thickness of this layer may be in the order of 400 nm.

Next a layer 124 is formed in amorphous silicon for example α-Si, using full wafer epitaxy for example. This layer 124 is relatively thick and will be used both to form the beams 6 and the mobile mass 4.

Lithography followed by etching is then performed on the layer 124 in α-Si, for example using DRIE. Etching is stopped at the SiO$_2$ layer.

Figure 8C:
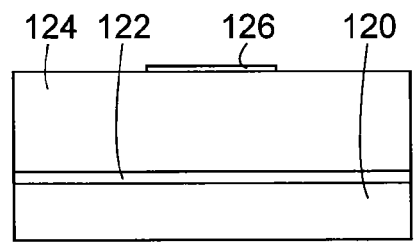
Figure 8B:
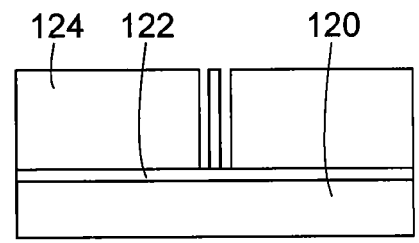

The element thus obtained is illustrated in FIG. 8B'. With this step it is possible during the same operation and in one same thickness of material to form both the resonant mass 4 and the beams 6.

Deposit, lithography and etching steps of the anti-reflective layer 126 are then performed. The element obtained is illustrated in FIG. 8C.

Figure 8D:
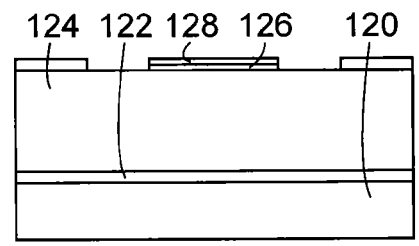
Figure 8D:
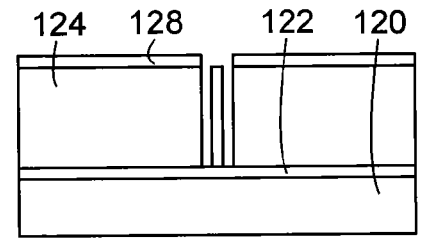

At a following step, a resin layer 128 is deposited on layer 124 and the anti-reflective layer 126, then this layer 128 is lithographed to delimit the regions to be thinned to form the beams 6. The element thus obtained is illustrated in FIGS. 8D and 8D'.

Figure 8E:
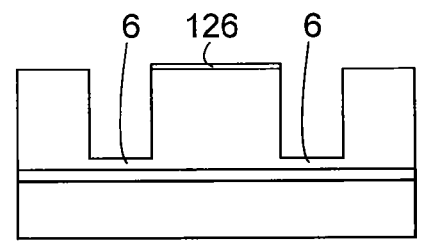
Figure 8E:
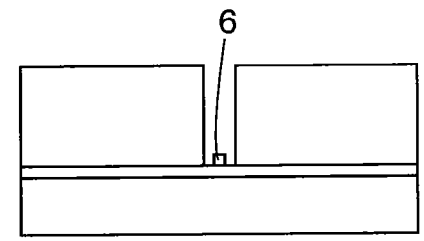

At a following step the regions delimited by the resin are thinned e.g. etched by Reactive-Ion Etching RIE, or DRIE. The remaining resin is removed. The element obtained is illustrated in FIGS. 8E and 8E'.

Finally, at a following step the mobile mass is released by etching e.g. by wet or dry etching the oxide layer 28 with hydrofluoric acid.

Figure 8F:
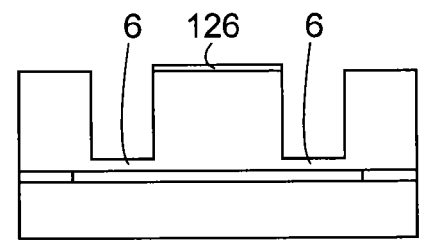
Figure 8F:
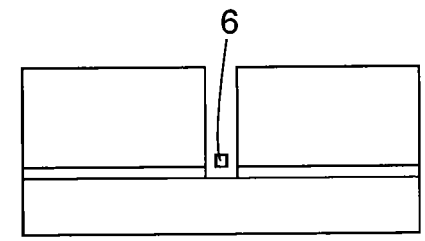

The final structure is shown in FIGS. 8F and 8F'. The mobile mass 4, the beams 6, the anti-reflective layer 19 and the resonant cavity 17 can be seen.

The reflective layer is formed for example by post-processing on the substrate carrying the electronics, this then being assembled with the substrate carrying the bolometers.

The bolometer obtained with one of the above-described methods, or another, is connected to the electronic circuit 31 controlling the bolometer, this circuit ensures powering of the bolometer, controls the setting in self-oscillation of the mobile mass 4 via the actuation electrodes 12 and measures the variation in vibration frequency of the mobile mass 4 e.g. via the detection electrodes 14. Means for computing the corresponding temperature of the environment from the measurement of the variation in frequency can be provided in the electronic circuit, or an additional system can be associated. The electronic circuit is formed on a CMOS for example.

Figure 9:
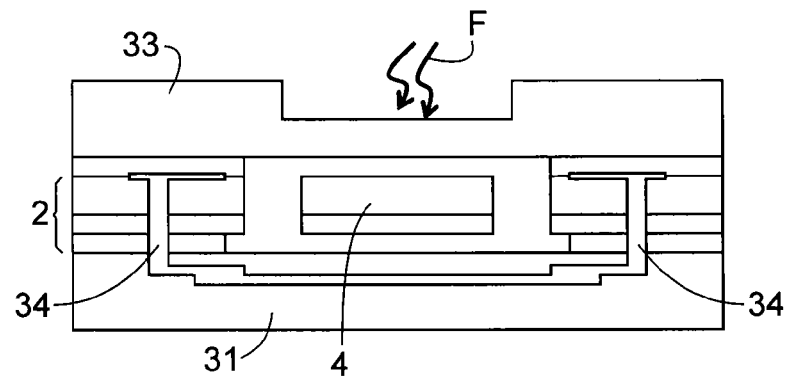
FIG. 9 is a side view of an assembly of a bolometer according to the invention with its electronic control circuit.

As schematically illustrated in FIG. 9, the assembling of the electronic control circuit 31 with the bolometer 2 of the invention can most advantageously be obtained by wafer-to-wafer bonding for example, and the electric connections between the electrodes of the bolometer 2 and the circuit 31 can be formed using 3D interconnection techniques e.g. of TSV type (Through Silicon Via) to form through connecting vias 34. In this configuration, the reflective mirror is deposited by post-process on the substrate corresponding to the electronic circuit.

Examples of wafer-to-wafer bonding are described in the document "*Wafer-level Bonding/Stacking Technology for 3D Integration*", Cheng-Ta Ko, Kuan-Neng Chen, *Microelectronics Reliability* 50 (2010) 481-488.

This example of assembly embodiment is also particularly adapted for an array of bolometers. The assembly in FIG. 9 additionally comprises an optical focusing device 33 which is assembled on the bolometer opposite the electronic control circuit 31 and is inserted between the optical flux F and the bolometer.

The assembling of the optical device and of the bolometer is obtained by wafer-to-wafer bonding for example.

The assembling of the optical device and of the bolometer is preferably performed after assembling the bolometer 2 with the electronic control circuit 31.

As a variant, it can be envisaged to apply a so-called "above IC" process, the bolometer or the array of bolometers would then be prepared on the substrate carrying the electronic control circuit by successive deposits of layers and etching, using post-CMOS technology for example.

Figure 11A:
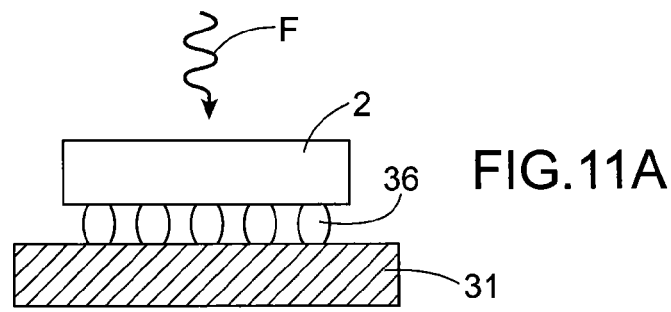
FIGS. 11A and 11B are schematic illustrations of examples of assembly between the bolometer and the associated electronic circuit via micro-ball bumping.
Figure 11B:
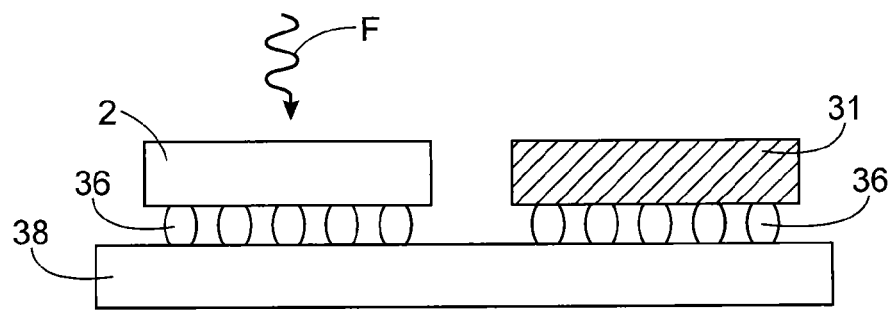

Other assembly and connection methods can be envisaged, for example wirebonding or micro ball bumping. In FIGS. 11A and 11B examples of assembly by micro-ball bumping can be seen.

In FIG. 11A, the bolometer 2 is directly assembled onto the control circuit 31 by means of indium balls 36, as a variant gold could be used or another suitable metal. The balls are then used both for assembling and for connections.

In FIG. 11B, the bolometer 2 and the control circuit are arranged side by side on a common substrate 38 and assembled thereupon via balls 36. The substrate then comprises the interconnects between the control circuit 31 and the bolometer 2.

The invention claimed is:

1. A bolometer comprising:
   a substrate;
   at least one electromechanical microsystem or nanosystem, the microsystem or nanosystem comprising a support and a mobile mass hung above the support by at least two beams anchored to the substrate, the mobile mass forming an absorber of optical flux;
   actuators disposed on the substrate and configured to cause the mobile mass to vibrate at a resonance frequency thereof in accordance with a deformation mode of the mobile mass in a median plane thereof, the median plane being substantially parallel to the substrate; and
   detectors disposed on the substrate and configured to detect variation in vibration frequency of the mobile mass, a thickness of the beams being at least ten times smaller than a thickness of the mobile mass.

2. The bolometer according to claim 1, wherein the mobile mass is in plate form, the median plane of the mobile mass being the plane of the plate.

3. The bolometer according to claim 1, wherein the actuators are of electrostatic type and include at least one actuation electrode on the support arranged laterally relative to the mobile mass.

4. The bolometer according to claim 1, wherein the detectors are of capacitive type and include at least one detection electrode on the support arranged laterally relative to the mobile mass.

5. The bolometer according to claim 1, wherein the at least two beams arranged along vibration nodes of the mobile mass.

6. The bolometer according to claim 1, further comprising anti-reflective layers on a first surface of the mobile mass configured to receive the optical flux.

7. The bolometer according to claim 1, further comprising a layer of a material having a different coefficient of expansion to that of the mobile mass, the layer being disposed on a first surface of the mobile mass and being configured to receive the optical flux.

8. The bolometer according to claim 7, further comprising anti-reflective layer on the first surface of the mobile mass configured to receive the optical flux, and wherein the anti-reflective layer forms the layer of material having a different coefficient of expansion to that of the mobile mass.

9. The bolometer according to claim 1, further comprising an optical reflector on a second surface of the mobile mass opposite a first surface thereof and configured to receive the optical flux, the mobile mass forming an optical resonant cavity.

10. The bolometer according to claim 1, further comprising an optical reflector on the support facing a second surface of the mobile mass opposite a first surface thereof and configured to receive the optical flux, so as to form an optical resonant cavity between the optical reflector and the second surface of the mobile mass.

11. The bolometer according to claim 10, wherein the optical reflector is separated from the mobile mass by a distance of an order of $\lambda/4$, $\lambda$ being the wavelength of the optical flux to be measured.

12. The bolometer according to claim 1, wherein the mobile mass and the at least two beams are formed of a crystalline semiconductor in silicon or SiGe.

13. The bolometer according to claim 1, wherein the material of the at least two beams is different from that of the mobile mass.

14. An assembly of bolometers according to claim 1, arranged in an array.

15. A temperature measuring assembly comprising one bolometer according to claim 1 and an electronic control circuit coupled to the bolometer and configured to cause the bolometer to be powered, to control the actuators to cause the mobile mass to vibrate, and to measure a variation in vibration frequency of the mobile mass via the detectors.

16. The measuring assembly according to claim 15, wherein the electronic control circuit sets the mobile mass or an assembly of mobile masses in vibration in accordance with volume modes, or an extensional wine-glass mode, or Lamé mode.

17. The measuring assembly according to claim 15, further comprising an optical focusing device arranged above the bolometer and configured to be inserted between the optical flux and a first surface of the mobile mass.

18. The measuring assembly according to claim 15, wherein the electronic control circuit is assembled with the bolometer, the control circuit and the bolometer being superimposed.

19. The measuring assembly according to claim 15, further comprising at least one actuation wire to send from the electronic control circuit actuation signals of different frequencies to one bolometer simultaneously, and at least one detection wire to collect detection signals of different frequencies from one bolometer and provide the detection signals to the electronic control circuit.

* * * * *